United States Patent [19]

Carpenter et al.

[11] 3,858,061

[45] Dec. 31, 1974

[54] MULTIPLE SIZE GATES ON FET CHIPS

[75] Inventors: Robert G. Carpenter; Maurice T. McMahon, Jr., both of Wappingers Falls, N.Y.

[73] Assignee: International Business Machines Corporation, Armonk, N.Y.

[22] Filed: Dec. 27, 1972

[21] Appl. No.: 318,966

[52] U.S. Cl. .................. 307/279, 307/303, 307/304, 357/41

[51] Int. Cl. ....... H03k 3/26, H03k 3/33, H01l 11/00

[58] Field of Search ........... 307/279, 303, 304, 215; 317/235 B, 235 G

[56] References Cited

UNITED STATES PATENTS

| | | | |
|---|---|---|---|
| 3,041,477 | 6/1962 | Budts et al. | 307/291 X |
| 3,474,262 | 10/1969 | Turcotte | 307/289 |
| 3,573,507 | 4/1971 | Eng | 307/279 |
| 3,638,047 | 1/1972 | Klein | 307/293 |
| 3,652,906 | 3/1972 | Christensen | 317/235 |
| 3,691,401 | 9/1972 | Forlani | 307/215 |
| 3,753,011 | 8/1973 | Faggin | 307/279 X |

*Primary Examiner*—Andrew J. James
*Assistant Examiner*—L. N. Anagnos
*Attorney, Agent, or Firm*—Sughrue, Rothwell, Mion, Zinn & Macpeak

[57] ABSTRACT

Variation of the gate size of an FET gate may be used to vary the interelectrode capacitance of the FET, thus varying the turn on time of the FET. By varying the gate size of individual FETs on a single chip, the turn on times of the FETs within a particular logic circuit will be different, and these time differences can be used to eliminate races or to equalize the delays along signal paths within the logic circuit. Because the interelectrode capacitance is used to effect the delays, additional delay circuits are not required. Furthermore, by proper arrangement of the FETs the turn on sequence of FETs within a logic circuit can be predicted and thus the response of a logic circuit to a test pattern can be predicted.

1 Claim, 4 Drawing Figures

MULTIPLE SIZE GATES ON FET CHIPS

BACKGROUND OF THE INVENTION

1. Field of the Invention

This invention relates to integrated circuits or chips comprising a plurality of FETs (field effect transistors) and in particular to an integrated circuit in which the gate size of the FETs is different for particular FETs in order to produce different interelectrode capacitances on the FETs and thus different turn on times for the FETs.

2. Description of the Prior Art

In some prior art FET logic circuits, the sequence in which particular FETs turn ON is critical. In other words, if a first FET turns ON before a second FET, the logic circuit will produce one output, whereas if the second FET turns ON prior to the first FET, a different output will be produced. The chip on which the FETs are constructed may be arranged such that the delays along the signal paths to the two FETs are approximately the same, and, therefore, when a signal is applied to the two FETs, the output is unpredictable since there is a race between the turning ON of the two FETs.

The race problem can be eliminated by the insertion of delay circuits or blocks in the chip. However, this requires additional circuits, thus increasing the size of the chip. Chip size, of course, is a critical factor in miniaturized circuits.

Construction of integrated circuits with a plurality of FETs having different gate sizes on the same chip is old in the art as shown in U.S. Pat. Nos. 3,539,839 and 3,573,507. However, the variation in gate size is used to change the conductance of the channel of the FET and thus change the impedance of the transistor during the ON state.

SUMMARY OF THE INVENTION

By controlling the interelectrode capacitance of an FET, the turn on time of the FET can be controlled. The interelectrode capacitance is a function of the size of the gate electrode of the FET. Therefore, by designing the gate electrode to a particular size, the interelectrode capacitance of the FET can be controlled.

Using this technique on particular FETs within a logic circuit on a particular chip, race conditions in the logic circuit can be eliminated by providing a delay in the turn on of a particular FET with respect to the other FET with which the race occurs. Furthermore, delays may be introduced by varying the interelectrode capacitance in order to equalize the delays along signal paths through the logic circuit where the necessity for equalization exists. Since the delays for eliminating races or for equalizing signal paths are effected by merely designing the gate to a particular size, the addition of delay circuits as required in the prior art is obviated, thus providing economies in circuit size, etc.

It is the object of this invention to provide an integrated circuit comprising a plurality of FETs wherein the interelectrode capacitance of some of the FETs is different from the interelectrode capacitance of others of the FETs, such that the turn on times of the FETs are different.

It is another object of this invention to eliminate races in an FET logic circuit by introducing predetermined delays by designing the FETs within the logic circuit with different turn on times.

It is still another object of this invention to equalize signal paths by equalizing the delays along the paths in an FET logic circuit by introducing predetermined delays by designing the FETs within the logic circuit with different turn on times.

It is a further object of this invention to provide FETs with predetermined turn on times by designing the gates to a predetermined size.

DESCRIPTION OF THE PREFERRED EMBODIMENTS

Figure 1A:
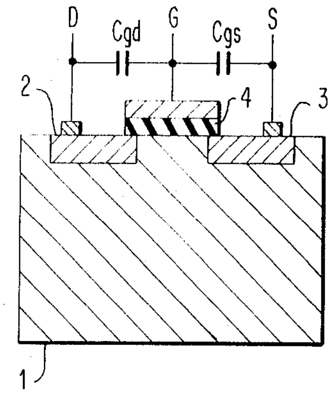
FIG. 1*a* shows an FET having a first gate electrode.

FIG. 1*a* shows an insulated gate FET having a substrate body 1, a drain 2 and a source 3. Dielectric layer 4 insulates the gate electrode G from the source and drain regions. $C_{gd}$ represents the gate to drain capacitance and $C_{gs}$ represents the gate to source capacitance.

Figure 1B:
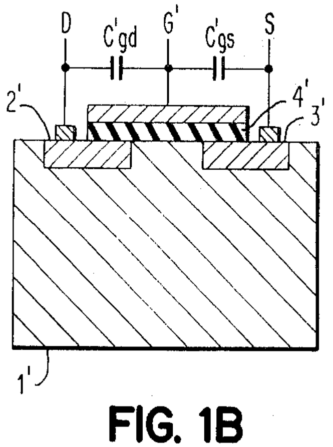
FIG. 1*b* shows another FET having a second gate electrode of a different size than the electrode of the FET shown in FIG. 1*a*.

FIG. 1*b* shows a second insulated gate FET having a substrate body 1', a drain 2' and a source 3'. Dielectric layer 4' and gate G' are considerably larger in physical size than the gate G in FIG. 1*a*. The difference in size changes the value of the interelectrode capacitance of the FET in FIG. 1*b* with respect to the FET in FIG. 1*a*. In FIG. 1*b*, $C'_{gd}$ represents the gate to drain capacitance while $C'_{gs}$ represents the gate to source capacitance.

It is well known that insulated gate FETs have a threshold voltage at which they turn ON. The turn on time is a function of the interelectrode capacitance of the FET. Therefore, if the FETs shown in FIGS. 1*a* and 1*b* have the same threshold voltage, the turn on time required would be different due to the difference in interelectrode capacitance.

Figure 2:
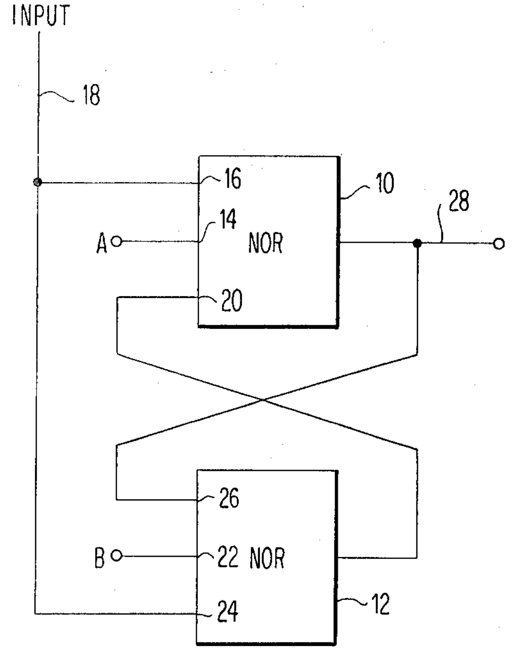
FIG. 2 is a circuit diagram of a logic circuit incorporating the present invention.

FIG. 2 shows a logic circuit incorporating the present invention. This circuit also could be constructed as an integrated circuit on a single chip employing FETs wherein the size of the input gate 16 to NOR circuit 10 is different than the size of the input gate 24 to NOR circuit 12. The gates are constructed such that NOR circuit 12 will always switch faster than NOR circuit 10, when controlled from input bus 18.

NOR circuit 10 has a first input 14 for receiving a logic signal, a second input 16 connected to bus 18 for receiving a control input, and a third input 20 connected to the output of NOR circuit 12. NOR circuit 12 has a first input 22 for receiving a logic input, a second input 24 for receiving a control signal from bus 18 and a third input 26 for receiving the output 28 of NOR circuit 10.

In operation, when the chip has been powered up, bus 18 is brought to a logic 1 level. This forces NOR circuits 10 and 12 to a logic 0 level regardless of the other inputs thereto. A test pattern of all 0's is set up at the input 14 and 22 of NOR circuits 10 and 12, respectively. Since the bus 18 is at a logic 1 level, the output of the NOR circuits are still maintained at a logic 0 level. Bus 18 is then switched from logic 1 to logic 0 level. Since NOR circuit 12 always switches faster than NOR circuit 10 when controlled from bus 18 due to its predetermined interelectrode capacitance, it will produce a logic 1 at input 20 of NOR circuit 10, thus the output 28 of NOR circuit 10 will remain at logic 0. Since the output 28 is predictable upon the switching of the control input applied to bus 18 from logic 1 to logic 0 testing of the logic circuit can now proceed using inputs A and B since the output 28 is in a known state. In other words, sequential type logic circuits are driven to a known logical condition by virtue of this invention and thus allow simplified testing techniques. If output 28 should switch to logic 1, then it is readily apparent that there is a fault in the logic circuit.

Figure 3:
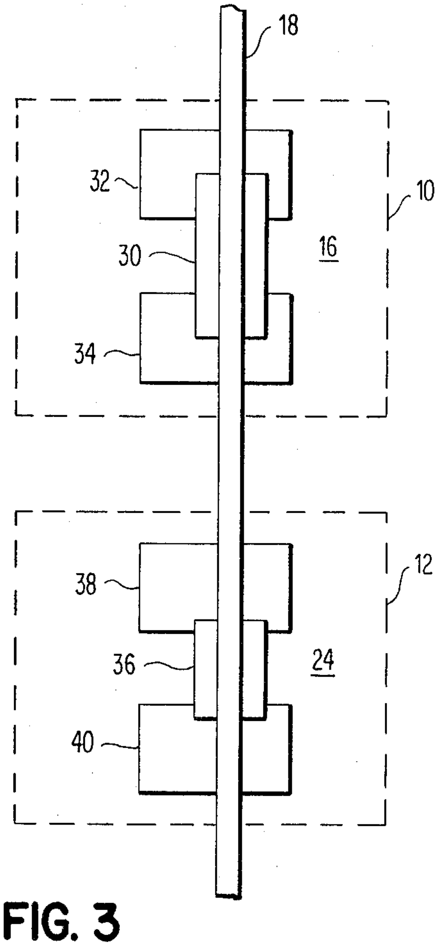
FIG. 3 shows the physical arrangement of the control bus and gate electrodes of the logic circuit shown in FIG. 2.

FIG. 3 shows the construction of the control bus and gate electrodes of the input FET in NOR circuits 10 and 12. The bus 18 is connected to gate electrode 30 positioned over source 32 and drain 34 of the input FET of NOR gate 16. Bus 18 is also connected to gate 36 positioned over source 38 and drain 40 of the input FET of NOR circuit 12. Note that the physical size of gate 30 is different than the size of gate 36. This accounts for the difference in interelectrode capacitance of the two NOR gates. The difference in interelectrode capacitance effects the different turn on times for the different NOR gates. By selection of a particular size gate, a particular turn on time can be selected.

The embodiment shown in FIG. 2 can of course be expanded for large-scale integrated circuits (LSI) to include any number of NOR circuits with the control input on bus 18 connected to all of the gates. Moreover, the invention covers any type (not necessarily NOR) of sequential logic circuits combined with either other sequential logic circuits or with combinatorial logic circuits. Because of the ability to predict the turn on sequence of each internal logic circuit, the output of the total configuration can be predicted.

The technique of varying the gate size to vary the interelectrode capacitance and thus the turn on time of the FET can be utilized to eliminate race conditions in logic circuits, thus giving predictable outputs in response to a given input in logic circuits. Furthermore, the technique may be used to add delays in a circuit in order to equalize signal paths through the logic circuit.

As is evident, the variation in turn on time can be effected without the addition of delay circuits to the chip.

While the invention has been particularly shown and described with reference to the preferred embodiment thereof, it will be understood by those skilled in the art that various changes in form and details may be made therein without departing from the spirit and scope of the invention.

We claim:

1. In an integrated circuit including a plurality of FETs connected to form at least one circuit having more than one signal path, each signal path having different signal delays, the improvement providing equalization of the delays in the signal paths through said integrated circuit comprising:

a. at least one first FET in a first of said signal paths having a first gate electrode, said first gate electrode having a first predetermined size determining the inter-electrode capacitance of said first FET which, in turn, defines a first turn-on time for said first FET; and b. at least one second FET in a second signal path having a second gate electrode, said second gate electrode having a second predetermined size different from said first predetermined size and determining the inter-electrode capacitance of said second FET which, in turn, defines a second turn-on time different from said first turn-on time for said second FET, said first and second turn-on times being chosen to equalize the delays in said first and second signal paths through said integrated circuit.

* * * * *